(12) United States Patent
Umetsu et al.

(10) Patent No.: US 6,528,831 B2
(45) Date of Patent: Mar. 4, 2003

(54) SOLID-STATE IMAGE PICKUP DEVICE

(75) Inventors: Hiroo Umetsu, Miyagi (JP); Shinji Uya, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/060,368

(22) Filed: Feb. 1, 2002

(65) Prior Publication Data
US 2002/0100922 A1 Aug. 1, 2002

(30) Foreign Application Priority Data

Feb. 1, 2001 (JP) ........................................ 2001-025673

(51) Int. Cl.$^7$ ...................... H01L 27/148; H01L 29/768
(52) U.S. Cl. ........................ 257/233; 257/232; 257/240; 257/241; 257/250
(58) Field of Search ................................. 257/231, 232, 257/233, 240, 241, 249, 250

(56) References Cited

U.S. PATENT DOCUMENTS

| | | | | |
|---|---|---|---|---|
| 4,242,700 A | * | 12/1980 | Weimer | ........................ 358/44 |
| 5,399,888 A | * | 3/1995 | Nakashiba | .................... 257/233 |
| 5,793,071 A | * | 8/1998 | Sekine | ......................... 257/240 |

FOREIGN PATENT DOCUMENTS

JP     2001-111027     4/2001

* cited by examiner

Primary Examiner—Ngân V. Ngô
(74) Attorney, Agent, or Firm—Arent Fox Kintner Plotkin & Kahn, PLLC

(57) ABSTRACT

As solid-state image pickup devices are spread in the world, improvement of performance and reduction of the production cost thereof are required. It is difficult for the solid-state image pickup devices of a configuration of the prior art to meet the requirements. In a solid-state image pickup device to meet the requirements, a large number of photoelectric converters are disposed in a surface of a semiconductor substrate in of a matrix pattern having a plurality of row and a plurality of column, a vertical charge transfer channel is arranged for each column of the photoelectric converters, and a read-cum-transfer electrode is formed for each row of the photoelectric converters such that the read-cum-transfer electrode surrounds each photoelectric converter element of the associated row of the photoelectric converters in a plan view.

16 Claims, 7 Drawing Sheets

SOLID-STATE IMAGE PICKUP DEVICE

CROSS-REFERENCE TO RELATED APPLICATION

This application is based on Japanese Patent Application 2001-25673 filed on Feb. 1, 2001, the entire contents of which are incorporated herein by reference.

BACKGROUND OF THE INVENTION a) Field of the Invention

The present invention relates to a solid-state image pickup device using charge-coupled devices (CCD), and in particular, to an interline transfer type solid-state image pickup device using CCD.

b) Description of the Related Art

After the CCD mass-producing technique has been established, image pickup devices such as an electronic still camera and a digital camera employing a solid-state image pickup device using CCD, particularly, an interline transfer type solid-state image pickup device using CCD have been rapidly developed and spread. In the description below, the solid-state image pickup device using CCD and conducting an interline transfer operation including a frame interline transfer operation will be simply referred to as "solid-state image pickup device".

A solid-state image pickup device includes, for example, a semiconductor substrate, a large number of photoelectric converter elements or photoelectric converters formed in one surface of the semiconductor substrate in a contour of an array having rows and columns, a vertical charge transfer element disposed for each column of the photoelectric converters, one horizontal charge transfer element electrically connected to the vertical charge transfer elements, and an output amplifier electrically connected to one end port of the horizontal charge transfer element.

The photoelectric converter is a photo diode in general, and the number of photoelectric converters ranges, for example, from about several hundreds of thousands to about several millions. In the known solid-state image pickup devices, the photoelectric converters are arranged in a pattern of a square matrix (also including a matrix of which the number of rows is not equal to that of the columns in this specification) or the photoelectric converters are arranged in a shifted-pixel layout.

In this specification, the shifted-pixel layout is an arrangement of the photoelectric converters in which each photoelectric converter of an even photoelectric converter column is shifted relative to an associated photoelectric converter of an odd photoelectric converter column by about one half of the pitch in the column direction. Similarly, each photoelectric converter of an even photoelectric converter row is shifted relative to an associated photoelectric converter of an odd photoelectric converter row by about one half of the pitch in the row direction. Each photoelectric converter column includes photoelectric converters of only odd or even rows. The shifted-pixel layout is a form of arrangement of a large number of photoelectric converters in a pattern of an array having rows and columns.

In this specification, "about one half of the pitch of the photoelectric converters in the photoelectric converter column" includes, in addition to one half of the pitch, any value which is different from one half of the pitch because of factors such as a manufacturing error and a rounding error of a pixel position appearing in a design phase or a mask fabrication process and which nevertheless can be regarded as substantially equivalent to one half of the pitch in consideration of obtained performance and picture quality of the solid-state image pickup device. This also applies to "about one half of the pitch of the photoelectric converters in the photoelectric converter row".

Each vertical charge transfer element of the solid-state image pickup device is a CCD and includes one channel (to be referred to as "vertical transfer channel" hereinbelow) extending along an associated photoelectric converter column and many electrodes (to be referred to as "vertical transfer electrodes" hereinbelow) which cross the vertical charge transfer channel in a plan view. The vertical charge transfer channel is formed in a surface of the semiconductor substrate, and each vertical transfer electrode is formed on an electrically insulating layer disposed on the semiconductor substrate.

Ordinarily, one or two vertical transfer electrodes are disposed for one photoelectric converter row. Each vertical transfer electrode extends along an associated photoelectric converter row on an upstream side or a downstream side of the photoelectric converters of the row. Each photoelectric converter is surrounded by two vertical transfer electrodes, that is, by one upstream vertical transfer electrode and one downstream vertical transfer electrode in a plan view.

In this specification, movement of charge from photoelectric converters to the output amplifier is regarded as a flow, and a relative position of each constituent member or the like is identified as a position upstream of, for example, a unit A or a position downstream of, for example, a unit A according to necessity.

FIG. 7 schematically shows an example of layout of photoelectric converters and vertical transfer electrodes of a solid-state image pickup device of the prior art in a plan view. In this layout, a solid-state image pickup device 500 is a solid-state image pickup device of type in which a large number of photoelectric converters 510 are disposed in one surface of a semiconductor substrate 501 in the shifted-pixel layout.

One vertical transfer electrode 525 or 526 is formed for each photoelectric converter row. Each vertical transfer electrode 525 or 526 meanders along the associated photoelectric converter row on a downstream side thereof, generally extending in the direction of the photoelectric converter row. For a photoelectric converter row immediately on the downstream side of the vertical transfer electrode 525 or 526, the electrode 525 or 526 meanders along the photoelectric converter row on an upstream side thereof. Each photoelectric converter 510 is surrounded by two vertical transfer electrodes 525 and 526, one electrode is disposed on the upstream side of the converter 510 and the other electrode is disposed on downstream side of the converter 510 as described above.

In the solid-state image pickup device, electric charge accumulated in a photoelectric converter by photoelectric conversion is read out to an associated vertical charge transfer element. To control the readout operation of charge from the photoelectric converter to the vertical charge transfer element, one readout gate is disposed for each photoelectric converter. In general, one of two vertical transfer electrodes surrounding one photoelectric converter in a plan view also serves as a gate electrode of the readout gate. The vertical transfer electrode serving as the gate electrode is referred to as "read-cum-transfer electrode" in this specification.

Each vertical charge transfer element is driven, for example, by four-phase vertical drive signals to transfer electric charge read out from the photoelectric converter to a horizontal charge transfer element.

The horizontal charge transfer element receives the electric charges from the vertical charge transfer elements and transfers the electric charges to an output amplifier. The horizontal charge transfer element is, for example, a CCD of two-phase drive type.

The output amplifier receives the electric charges from the horizontal charge transfer element, converts the charges into image signals (signals voltage), and then outputs the signals to a predetermined circuit.

With spread of the solid-state image pickup device in the world, improvement of performance and reduction in the production cost of the device have been required.

SUMMARY OF THE INVENTION

It is therefore an object of the present invention to provide a solid-state image pickup device in a configuration capable of improving the performance and reducing the production cost.

According to one aspect of the present invention, there is provided a solid-state image pickup device, comprising a semiconductor substrate having one surface; a large number of photoelectric converters formed in the one surface of said semiconductor substrate in a matrix pattern including a plurality of rows and a plurality of columns; a vertical charge transfer channel formed in the one surface of said semiconductor substrate adjacent to each column of said photoelectric converters; an electrically insulating layer disposed on the one surface of said semiconductor substrate; and a read-cum-transfer electrode formed on said electrically insulating layer, crossing said vertical charge transfer channels and surrounding photoelectric converters of each of said rows of the photoelectric converters in a plan view.

In the solid-state image pickup device, one vertical transfer electrode (read-cum-transfer electrode) is disposed for each photoelectric converter row. Each photoelectric converter of one photoelectric converter row is surround by the associated read-cum-transfer electrode in a plan view. Therefore, when compared with the solid-state image pickup device of the prior art in which each photoelectric converter is surrounded by two vertical transfer electrodes in a plan view such that one of the vertical transfer electrodes also serves as a read-cum-transfer electrode, it is possible in the above-described solid-state image pickup device to increase the line width of each read-cum-transfer electrode if both solid-state image pickup devices have the same integration degree of photoelectric converters.

Accordingly, the read-cum-transfer electrode can be more easily formed, which simplifies the production of the solid-state image pickup device itself. Therefore, a disadvantage that the degree of integration of photoelectric converters is limited by the line width of the read-cum-transfer electrode under fine manufacturing precision of the prior art rarely occurs. Resultantly, the photoelectric converters can be highly integrated in the solid-state image pickup device. The high degree of integration of the photoelectric converters facilitates improvement of resolution of the solid-state image pickup device.

BRIEF DESCRIPTION OF THE DRAWINGS

The objects and features of the present invention will become more apparent from the consideration of the following detailed description taken in conjunction with the accompanying drawings in which.

DETAILED DESCRIPTION OF THE PREFERRED EMBODIMENTS

Figure 1:
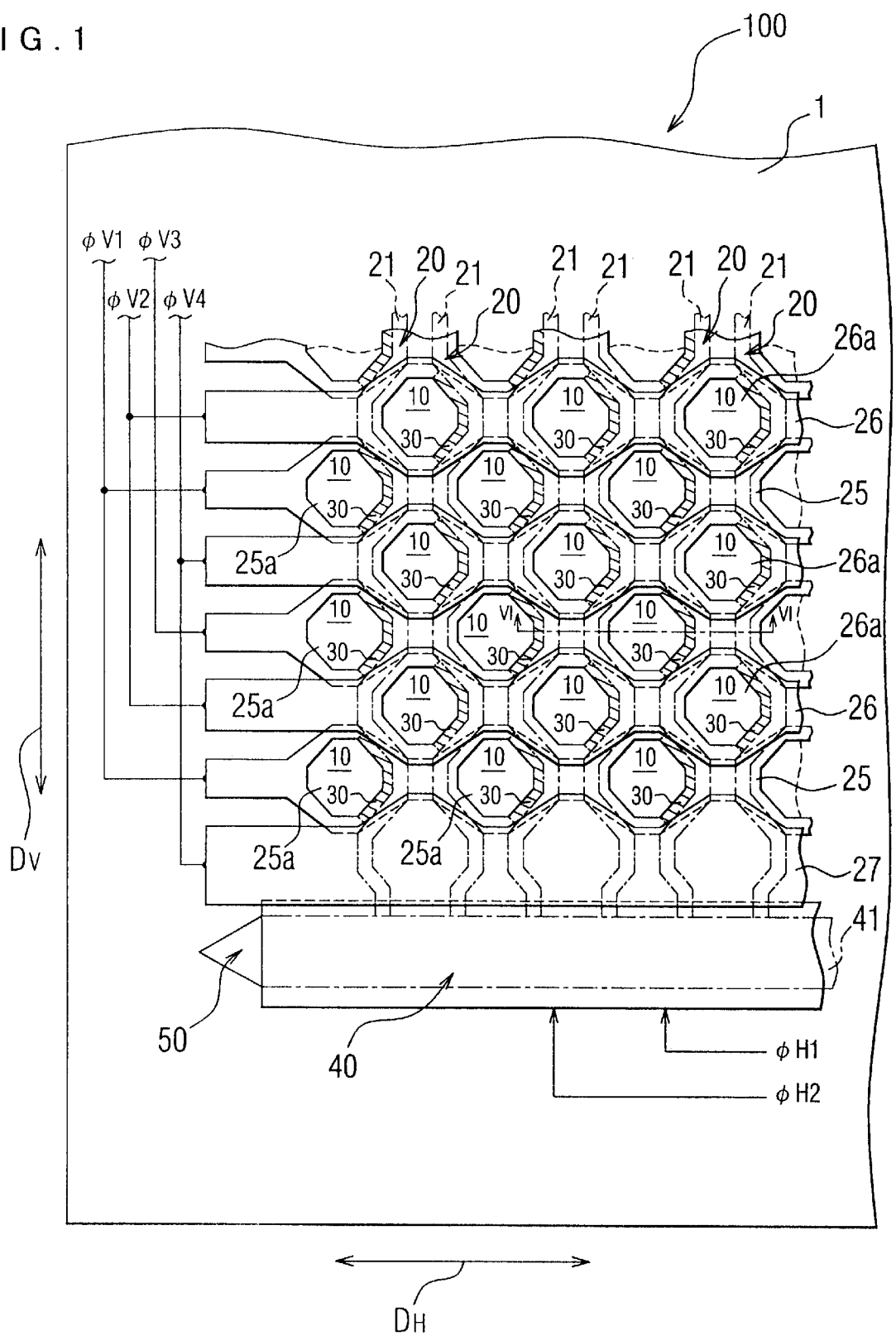
FIG. 1 is a plan view schematically showing layout of photoelectric converters, vertical charge transfer elements, a horizontal charge transfer element, and an output amplifier in a first embodiment of a solid-state image pickup device.

FIG. 1 schematically shows layout of photoelectric converters, vertical charge transfer elements, a horizontal charge transfer element, and an output amplifier in a first embodiment of a solid-state image pickup device in a plan view.

In the solid-state image pickup device 100 shown in FIG. 1, a large number of photoelectric converters 10 are arranged in a shifted-pixel layout in one surface of a semiconductor substrate 1. Each photoelectric converter 10 is, for example, a pn photodiode of buried type and is formed in a shape of, substantially an octagon in a plan view. When light enters the photoelectric converter 10, electric charge is accumulated therein.

For each photoelectric converter column, one vertical charge transfer element 20 is disposed along the photoelectric converter column.

Each vertical charge transfer element 20 includes one vertical charge transfer channel 21, a plurality of read-cum-transfer electrode, i.e., first and second read-cum-transfer electrodes 25 and 26 arranged in parallel with each other in a column direction $D_y$ of photoelectric converters, and a subordinate transfer electrode 27 arranged in parallel with a read-cum-transfer electrode 25 in a most downstream position on a downstream side of the electrode 25. Each of the first and second read-cum-transfer electrodes 25 and 26 and the subordinate transfer electrode 27 constitute part of each vertical charge transfer element 20.

For each odd photoelectric converter row relative to the subordinate transfer electrode 27, a first read-cum-transfer electrode 25 is arranged. For each even photoelectric converter row relative to the subordinate transfer electrode 27, a second read-cum-transfer electrode 26 is arranged.

The first and second read-cum-transfer electrodes 25 and 26 extend in a row direction of photoelectric converters $_{DH}$, surrounding each photoelectric converter 10 of an associated photoelectric converter row. The first and second read-cum-transfer electrodes 25 and 26 respectively have an opening 25a or an opening 26a for each associated photoelectric converter 10. Each opening 25a and 26a are dispose over the associated photoelectric converter 10. Each photoelectric converter 10 is placed substantially in an associated opening 25a or 26a in a plan view.

Each of the vertical transfer electrodes (the first read-cum-transfer electrode 25, the second read-cum-transfer electrode 26, and the subordinate transfer electrode 27) is formed on an electrically insulating layer, not shown, disposed on the semiconductor substrate 1. Each first read-cum-transfer electrode 25 is formed using, for example, a first polysilicon layer. Each second read-cum-transfer electrode 26 and the subordinate transfer electrode 27 are formed using, for example, a second polysilicon layer.

The first and second read-cum-transfer electrodes 25 and 26 mutually adjacent to each other are formed in an overlapping transfer electrode configuration. An edge section of the second read-cum-transfer electrode 26 along the extending direction thereof overlaps with an edge section of the first read-cum-transfer electrode 25 along the extending direction thereof. Similarly, the first read-cum-transfer electrode 25 and the subordinate transfer electrode 27 mutually adjacent to each other are formed in an overlapping transfer electrode configuration. The vertical transfer electrodes 25 to 27 are electrically isolated from each other by an electrically insulating layer (thermal oxidation layer) formed on surfaces respectively of the electrodes 25 to 27.

Each vertical charge transfer element 20 corresponds to one photoelectric converter element 10 in the every second photoelectric converter row. Each vertical charge transfer element 20 has two vertical transfer electrodes for each photoelectric converter 10 and is driven, for example, by four-phase vertical drive signals ($\phi$V1 to $\phi$V4. The vertical transfer electrodes 25 to 27 are classified into four groups which respectively receive mutually different vertical drive signals ($\phi$V1, $\phi$V2, $\phi$V3, and $\phi$V4. Each vertical transfer electrode group includes every fourth vertical transfer electrodes selected from the configuration shown in FIG. 1.

By appropriately selecting waveforms for the four-phase vertical drive signals $\phi$V1 to $\phi$V4, the readout of electric charges from the photoelectric converters 10 to the associated vertical charge transfer element 20 and the transfer of the read out charges from each vertical charge transfer elements 20 to the horizontal charge transfer element 40 can be conducted. Details of the horizontal charge transfer element 40 will be described later.

To control the readout operation of electric charges from the photoelectric converters 10 to the vertical charge transfer elements 20, one readout gate 30 is disposed for each photoelectric converter 10 adjacent thereto. Each readout gate 30 includes a channel region for the readout gate, not shown, formed in the semiconductor substrate 1 and part of the first or second read-cum-transfer electrode 25 or 26 arranged on the channel region. Each readout gate 30 (readout gate channel region) is disposed in a plan view between three edges of an associated photoelectric converter 10 and the vertical charge transfer channel 21 associated with the photoelectric converter 10.

In FIG. 1, each readout gate 30 is hatched for easy understanding of the position thereof.

Each photoelectric converter 10 of one photoelectric converter column can be electrically connected to an identical vertical charge transfer element 20 via the readout gate 30 disposed adjacent to the photoelectric converter 10. By applying a readout pulse signal to the first or second read-cum-transfer electrode 25 or 26, electric charges can be read out from the photoelectric converters 10 to the associated vertical charge transfer elements 20.

The readout operation of electric charges from the photoelectric converters 10 to the vertical charge transfer elements 20 is conducted by a unit of photoelectric converter row. The electric charges read out to vertical charge transfer elements 20 by a unit of photoelectric converter row are then transferred to the horizontal charge transfer element 40 under the same phase.

The horizontal charge transfer element 40 is, for example, a CCD of two-phase drive type driven by two-phase horizontal drive signals $\phi$H1 and $\phi$H2.

The horizontal charge transfer element 40 includes one channel 41 (to be referred to as "horizontal charge transfer channel 41" hereinbelow) formed in the surface of the semiconductor substrate 1 and many transfer electrodes (to be referred to as "horizontal transfer electrodes" hereinbelow) crossing the horizontal charge transfer channel 41 in a plan view. However, the horizontal transfer electrodes are not shown in the drawings.

For example, four horizontal transfer electrodes are disposed for each vertical charge transfer element 20. For example, a horizontal transfer electrode made of a first polysilicon layer and a horizontal transfer electrode made of a second polysilicon layer are alternately arranged in a direction from the upstream side of the horizontal charge transfer element 40 to the downstream side thereof. An electrically insulating layer of, for example, a silicon oxide layer (thermal oxidation layer) is formed on a surface of each horizontal transfer electrode. Two horizontal transfer electrodes adjacent to each other are commonly wired such that two horizontal charge transfer packets are formed for each vertical charge transfer element 20.

By appropriately selecting waveforms of the two-phase horizontal drive signals $\phi$H1 and $\phi$H2, electric charge can be received from each vertical charge transfer element 20 to sequentially transfer the received electric charges to an output amplifier 50.

The output amplifier 50 sequentially converts the electric charges received from the horizontal charge transfer element 40 into signals voltage using, for example, floating capacity, not shown and amplifies the signals voltage, for example, by a common source circuit, not shown, to generate image signals. The electric charge of the floating capacity after the detection (conversion) is absorbed by a power source, not shown, via a reset transistor, not shown. The output amplifier 50 can be structured in the similar manner as for, for example, an output section described in paragraphs 0084 to 0091 of JP-A-11-287326 by referring to FIG. 4(b).

In the solid-state image pickup device 100 shown in FIG. 1 described above, each vertical charge transfer element 20 includes one vertical charge transfer channel 21, one of the first and second read-cum-transfer electrodes 25 and 26 disposed for each photoelectric converter row, and one subordinate transfer electrode 27. Each photoelectric converter 10 of the photoelectric converter row is surrounded by one associated read-cum-transfer electrode 25 or 26 in a plan view.

Therefore, when compared with the solid-state image pickup device of the prior art in which each photoelectric converter is surrounded by two vertical transfer electrodes in a plan view such that one of the vertical transfer electrodes also serves as a read-cum-transfer electrode, it is possible in this embodiment to increase the line width of each of the read-cum-transfer electrodes 25 and 26. Accordingly, the read-cum-transfer electrodes 25 and 26 can be more easily formed, which simplifies the production of the solid-state image pickup device 100 itself. Consequently, a disadvantage that the degree of integration of photoelectric converters 10 is limited by the line width of the read-cum-transfer electrode rarely takes place. Resultantly, integration degree of the photoelectric converters 10 can be easily improved in the solid-state image pickup device 100. The high degree of integration of the photoelectric converters 10 facilitates improvement of resolution of the solid-state image pickup device 100.

When the solid-state image pickup device 100 is used as an area image sensor in practice, a light shielding layer is arranged to prevent unnecessary photoelectric conversion in areas other than the respective photoelectric converters 10, which will be described later. In the light shielding layer, one opening is disposed over each photoelectric converter 10. A light receiving area of each photoelectric converter 10 is substantially equal to an area of the associating opening of the light shielding layer in a plan view.

In the solid-state image pickup device 100, only one electrode surrounds the photoelectric converter 10. When compared with the configuration in which two electrodes surround the photoelectric converter 10, the number of positions at which steps are respectively formed in a periphery of the photoelectric converter 10 is reduced in the solid-state image pickup device 100. Therefore, a solid angle to look into the opening from the photoelectric converter 10 becomes greater. Light with a large incidence angle to the surface of the semiconductor substrate 1 can also enter the photoelectric converter 10, and hence the quantity of incident light to the photoelectric converter 10 is increased. This resultantly improves linearity between a sensitivity of the solid-state image pickup device 100 and an F-number of an image pickup optical system of the image pickup apparatus using the solid-state image pickup device 100.

Each readout gate 30 (readout gate channel region) is adjacent to three edges of its associated photoelectric converter 10 in a plan view. Therefore, when compared with the configuration in which each readout gate 30 is adjacent to, for example, one edge of its associated photoelectric converter 10 in a plan view, it is possible in this embodiment to lower a readout voltage (a depletion voltage to deplete the photodiode) required to read out all electric charge from the photoelectric converter 10 to the vertical charge transfer element 20. This reduces power consumption of the solid-state image pickup device 100.

In place of the reduction of the readout voltage (depletion voltage), it is also possible to increase the impurity concentration in each photoelectric converter 10 to thereby increase capacity per unitary area of the pn junction. This expands the dynamic range of the solid-state image pickup device 100.

In the solid-state image pickup device 100, since the first read-cum-transfer electrode 25 and the vertical charge transfer channel 21 have a particular relationship as described below, each vertical charge transfer element 20 has high transfer efficiency.

Figure 2A:
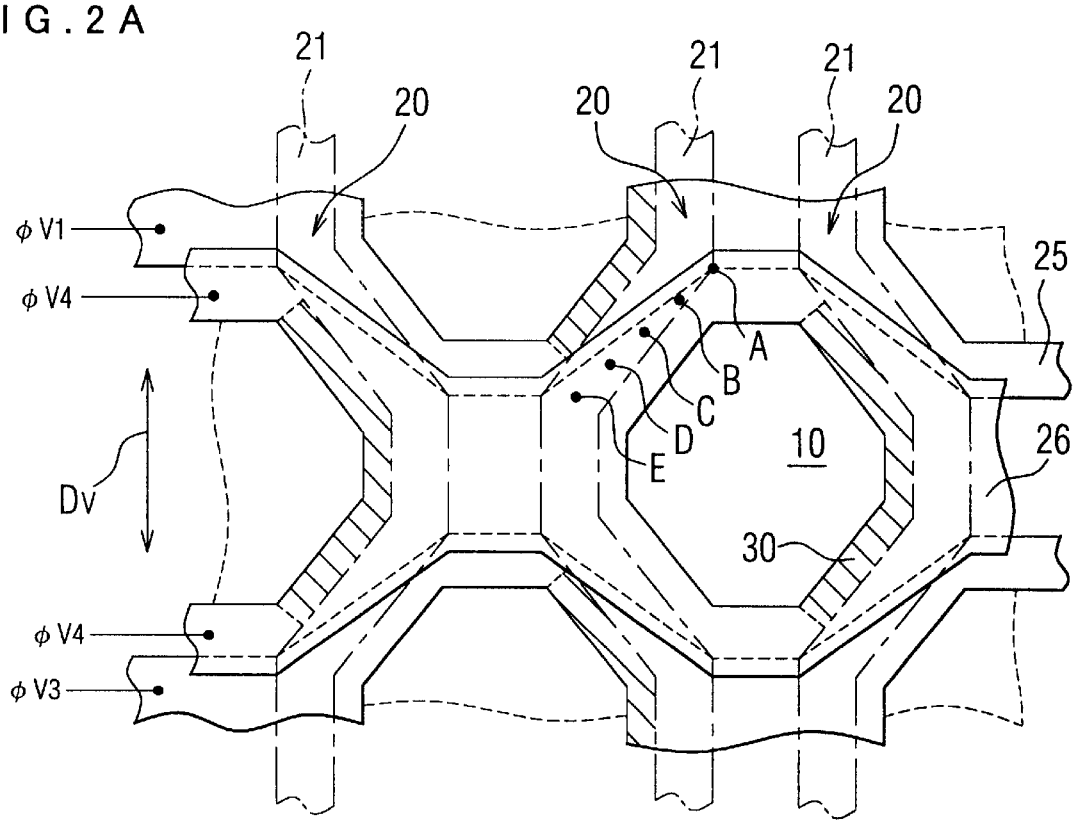
FIG. 2A is a magnified view of part of the first embodiment shown in FIG. 1.

FIG. 2A shows part of FIG. 1 in a magnified view. As can be seen from FIG. 2A, the contour and the size of each of the vertical charge transfer channel 21 and the first read-cum-transfer electrode 25 are selected such that a side surface of the first read-cum-transfer electrode 25 on the vertical charge transfer channel 21 obliquely intersect, as viewed in plan, the vertical charge transfer channel 21.

More concretely, when the first read-cum-transfer electrode 25 and the vertical charge transfer channel 21 are viewed in plan, in a rectangular region of the vertical charge transfer channel 21 oblique with respect to the photoelectric converter column direction $D_y$, the side surface of the first read-cum-transfer electrode 25 is substantially placed on a diagonal of the rectangular region.

When the contour and the size of each of the vertical charge transfer channel 21 and the first read-cum-transfer electrode 25 are selected as above, a potential slope advantageous to transfer electric charge can be formed in the rectangular region of the vertical charge transfer channel 21.

Figure 2B:
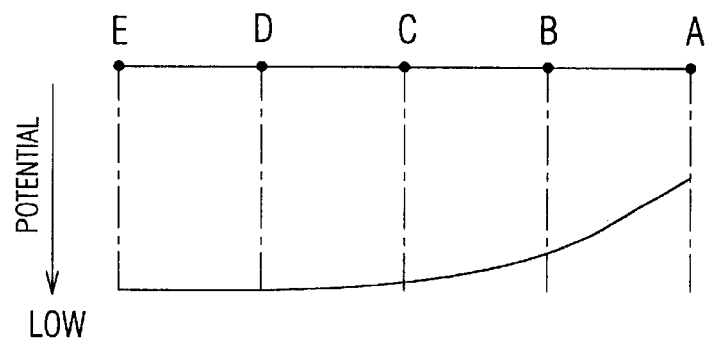
FIG. 2B is a graph schematically showing a potential profile in a range from point A to point E of a vertical charge transfer channel shown in FIG. 2A.

FIG. 2B schematically shows a potential profile in a region from point A to point E on the vertical charge transfer channel 21 shown in FIG. 2A.

The potential profile reflects a state in which electric charge distributed in a region below the first read-cum-transfer electrode 25 being supplied with the vertical drive signal $\phi V1$ is transferred to a region below the second read-cum-transfer electrode 26 being supplied with the vertical drive signal $\phi V4$. The signal $\phi V4$ is at a high (H) level, for example, 0 volt (V) and the vertical drive signal $\phi V1$ is at a low (L) level, for example, −8 V. The vertical drive signal $\phi V3$ is, for example, at a high (H) level.

As can be seen from FIG. 2B, when the electric charge distributed in a region below the first read-cum-transfer electrode 25 is transferred to a region below the second read-cum-transfer electrode 26, a potential slop is formed. The potential slope is inclined from a high-potential point A to a low-potential point E.

In the periphery of the photoelectric converter 10 in a plan view, a channel stop region is formed excepting the region to form the readout gate 30, which will be described later. Similarly, also in a region in which two vertical charge transfer channels 21 are adjacent to each other and no photoelectric converter 10 intervening therebetween, a channel stop region is formed. The channel stop region has a conductivity type opposite to that of the vertical charge transfer channel 21. Influenced by the adjoining channel stop region, a narrow channel effect appears in each vertical charge transfer channel 21.

However, by selecting the contour and the size of the vertical charge transfer channel 21 and the first read-cum-transfer electrode 25 as described above, influence of the narrow channel effect can be gradually reduced from point A to point E. As a result, the potential slope shown in FIG. 2B is obtained.

Consequently, when the electric charge distributed in a region below the first read-cum-transfer electrode 25 is transferred to a region below the second read-cum-transfer electrode 26, there rarely be made a potential basin (a stagnant pool of electric charge) under the first read-cum-transfer electrode 25. The electric charge can be transferred with high transfer efficiency without causing any transfer deterioration.

Also when the electric charge distributed in a region below the second read-cum-transfer electrode 26 is transferred to a region below the first read-cum-transfer electrode 25, the transfer deterioration is similarly prevented and hence the high transfer efficiency is obtained.

Since the charge transfer deterioration is rarely occurs in each vertical charge transfer element 20, fixed-pattern noise is easily prevented from appearing in an image reproduced from image signals outputted from the solid-state image pickup device 100. This easily increases picture quality of the reproduced image.

When it is desired to take, for example, a mobile picture using the solid-state image pickup device 100, the respective vertical charge transfer elements 20 are driven, for example, under a half thin-out scanning. In one half of the overall photoelectric converter rows, electric charges are read from the photoelectric converters 10 and are fed to the associated vertical charge transfer elements 20. According to the electric charge, image signals are generated.

For example, in the thin-out scanning, electric charge is read from each photoelectric converter 10 of the photoelectric converter rows (to be collectively referred to "A field" hereinbelow) corresponding to the first or second read-cum-transfer electrodes 25 or 26 supplied with the vertical drive signal φV1 or φV2 and is fed to the associated vertical charge transfer element 20. According to the electric charges, image signals are generated. When electric charges are read from the photoelectric converters 10 and are fed to the vertical charge transfer elements 20, readout voltage signal having a relatively high voltage, e.g., 15 V, is applied to the associated first or second read-cum-transfer electrodes 25 or 26.

Naturally, the half thin-out scanning can also be conducted as follows. Electric charge is read from each photoelectric converter 10 of the photoelectric converter rows (to be collectively referred to "B field" hereinbelow) corresponding to the first or second read-cum-transfer electrodes 25 or 26 supplied with the vertical drive signal φV3 or φV4 and is fed to the associated vertical charge transfer element 20.

To display a mobile picture at a high speed, the image signals of either one of the A and B fields are used. Or, electric charges are alternately read from the A and B fields to display a mobile picture.

When it is desired to shoot, for example, a still picture using the solid-state image pickup device 100, electric charges are separately read from the A field and the B field and image signals from the A field are combined with image signals from the B field to generate one frame of still picture data.

The respective vertical charge transfer elements 20 may also be driven using, for example, a charge transfer operation, namely, so-called "accordion transfer" described in "PHILIPS TECHNICAL REVIEW Vol. 43, No. 1/2, 1986" (A. J. P. Theuwissen and C. H. L. Weijitens). In response thereto, electric charges are simultaneously read from all of the photoelectric converters 10 to be fed into the associated vertical charge transfer elements 20. According to the electric charges, image signals for a still picture are generated.

To select photoelectric converters 10 to be read the electric charges at the same time and to transfer electric charges by the vertical charge transfer elements, various known methods can be employed in addition to the methods described above.

Next, description will be given of a solid-state image pickup device in a second embodiment by referring to FIG. 3.

Figure 3:
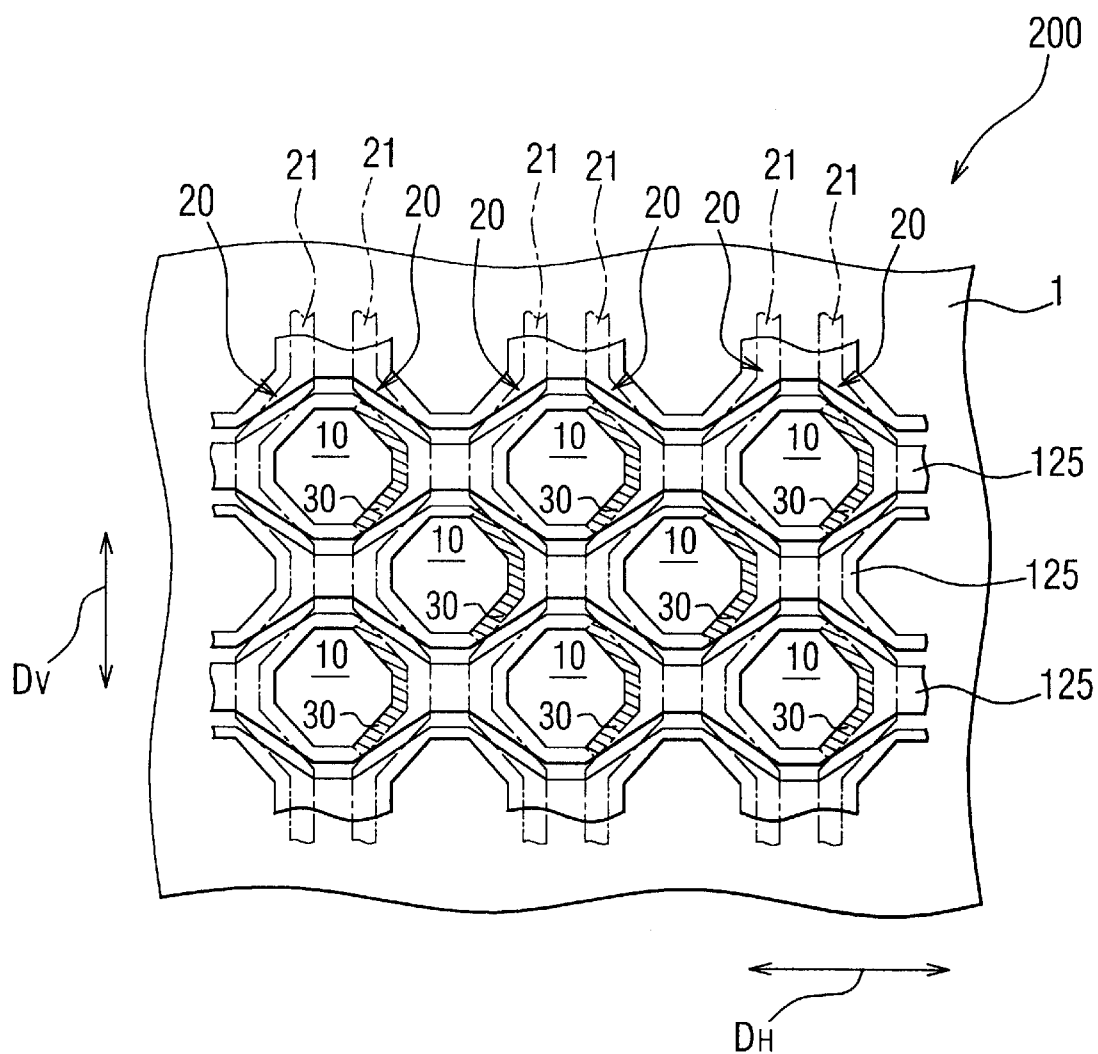
FIG. 3 is a plan view schematically showing layout of photoelectric converters and vertical charge transfer elements in a second embodiment of a solid-state image pickup device.

FIG. 3 schematically shows layout of the photoelectric converters 10 and the vertical charge transfer elements 20 of a solid-state image pickup device 200 in the second embodiment in a plan view.

The solid-state image pickup device 200 is substantially equal in configuration to the solid-state image pickup device 100 shown in FIG. 1 excepting the read-cum-transfer electrodes. FIG. 3 shows part of the photoelectric converters 10 and part of the vertical charge transfer elements 20 corresponding thereto. The other constituent components are not shown. In FIG. 3, same components as those shown in FIG. 1 are assigned with the same reference numerals, and description thereof will be omitted.

In the solid-state image pickup device 200, read-cum-transfer electrodes 125 are formed by patterning one conductive layer using, for example, photolithography or electron-beam lithography. The read-cum-transfer electrodes 125 are formed using a conductive material such as polycrystalline silicon or aluminum.

By setting a gap or space between adjacent two read-cum-transfer electrodes 125 to about 0.1 micrometer ($\mu$m) or less in a plan view, the vertical charge transfer elements 20 having practical transfer efficiency can be constructed without using the so-called overlapping transfer electrode configuration. The potential slope shown in FIG. 2B can also be formed.

Also in the solid-state image pickup device 200, the vertical transfer electrodes (read-cum-transfer electrodes) can be easily formed and hence the solid-state image pickup device itself can be easily produced for almost the same reason as for the solid-state image pickup device 100 shown in FIG. 1. The degree of integration of the photoelectric converters 10 can be easily increased, and it is possible to easily improve sensitivity of solid-state image pickup device 200 and linearity with respect to above-mentioned F-number of an image pickup optical system. The readout voltage (depletion voltage) of the photoelectric converter 10 can be easily lowered. The capacity per unitary area of the pn junction can be easily increased in the photoelectric converters 10. Since all vertical transfer electrodes can be formed through one conductive layer forming process and one patterning process, the production processes are simplified.

Description will now be given of a solid-state image pickup device in the third embodiment by referring to FIG. 4.

Figure 4:
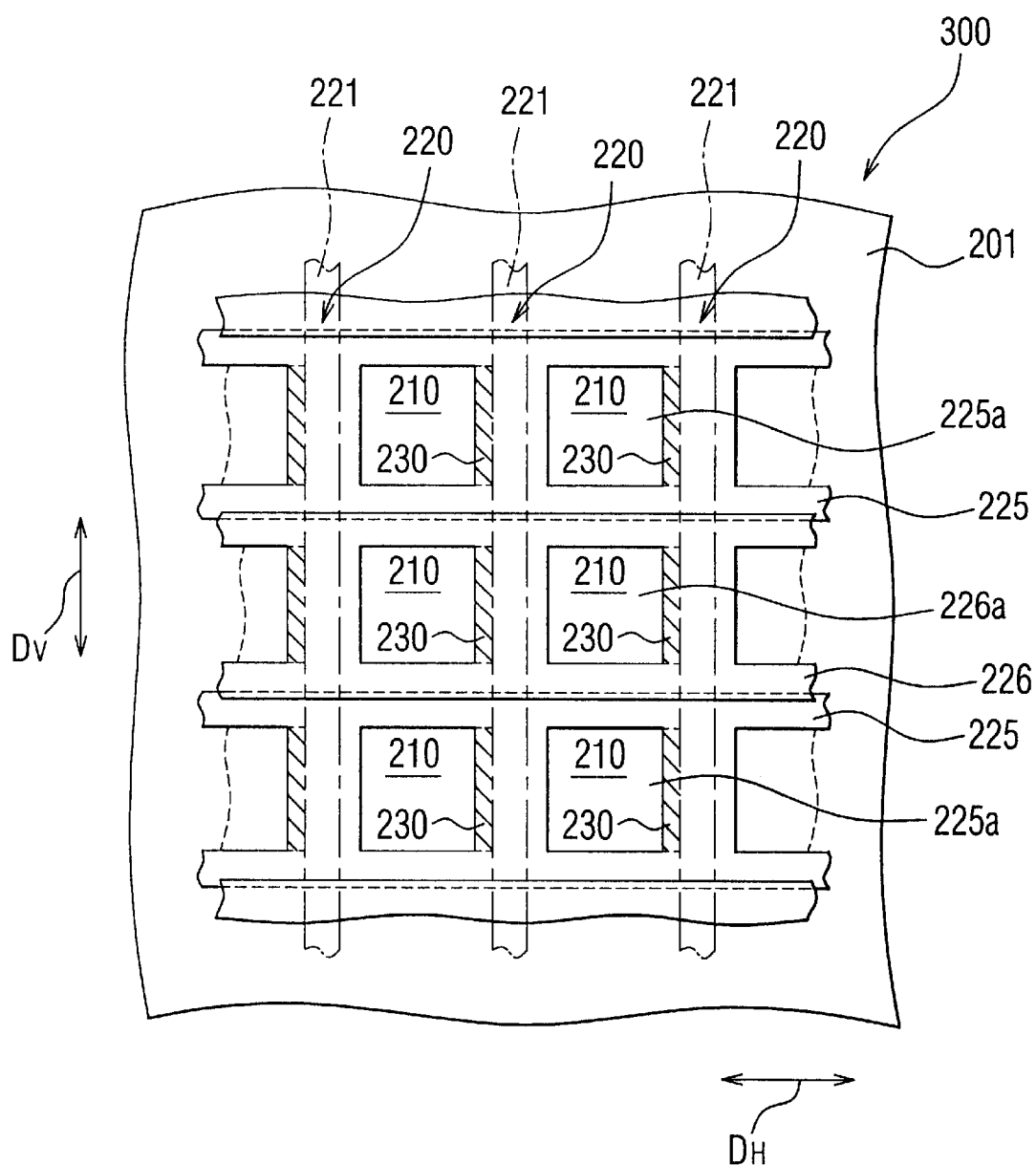
FIG. 4 is a plan view schematically showing layout of photoelectric converters and vertical charge transfer elements in a third embodiment of a solid-state image pickup device.

FIG. 4 schematically shows layout of photoelectric converters 210 and vertical charge transfer elements 220 of a solid-state image pickup device 300 in the third embodiment in a plan view.

The solid-state image pickup device 300 differs from the solid-state image pickup device 100 shown in FIG. 1 in six points (i) to (v) as below.

(i) A large number of photoelectric converters 210 are arranged in a surface of a semiconductor substrate 201 in a square matrix pattern having rows and columns.

(ii) Each photoelectric converter 210 has a rectangular form in a plan view.

(iii) Each vertical charge transfer channel 221 linearly extends along an associated photoelectric converter column in a photoelectric converter column direction $D_V$.

(iv) The line width of a first read-cum-transfer electrode 225 is substantially fixed when an opening 225a is not formed over each photoelectric converter 210. This also applies to a second read-cum-transfer electrode 226.

(v) Each readout gate 230 (readout gate channel region) is adjacent entirely to one edge of an associated photoelectric converter 210 in a plan view.

Excepting the differences (i) to (v), the solid-state image pickup device 300 is substantially equal in configuration to the solid-state image pickup device 100. Therefore, FIG. 4 shows part of the photoelectric converters 210 and part of the vertical charge transfer elements 220 corresponding thereto, and the other constituent components are not shown. In FIG. 4, same components as those shown in FIG. 1 are assigned with reference numerals obtained by adding 200 to the associated reference numerals used in FIG. 1, and description thereof will be omitted.

When compared with the solid-state image pickup device of the prior art in which a large number of photoelectric converters are arranged in a square matrix pattern, it is possible in the solid-state image pickup device 300 for the reason as for the solid-state image pickup device 100 shown in FIG. 1 that the vertical transfer electrodes (read-cum-transfer electrodes) can be easily formed, and the solid-state image pickup device itself can be easily produced. The integration degree of the photoelectric converters 210 can be easily increased. Sensitivity of the solid-state image pickup device 300 and linearity with respect to above-mentioned F-number of an image pickup optical system can be easily improved. The readout voltage (depletion voltage) of the photoelectric converters 210 can be easily lowered. The capacity per unitary area of the pn junction can be easily increased in the photoelectric converter 210.

Figure 5:
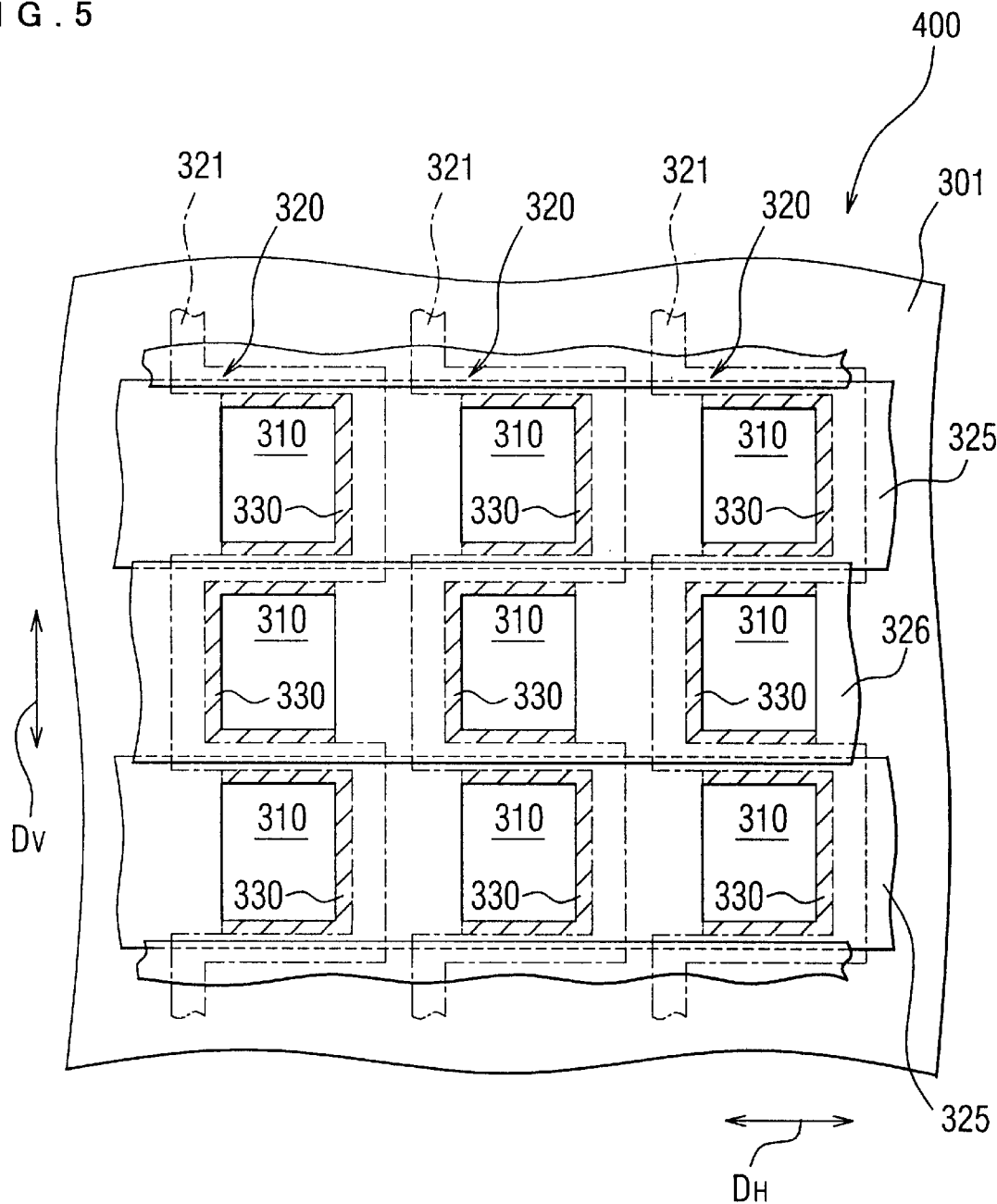
FIG. 5 is a plan view schematically showing layout of photoelectric converters and vertical charge transfer elements in a fourth embodiment of a solid-state image pickup device.

Referring next to FIG. 5, description will be given of a solid-state image pickup device in the fourth embodiment.

FIG. 5 schematically shows layout of photoelectric converters 310 and vertical charge transfer elements 320 of a solid-state image pickup device 400 in the fourth embodiment in a plan view.

The solid-state image pickup device 400 differs from the solid-state image pickup device 300 shown in FIG. 4 in two points (i) and (ii) as below.

(i) Each vertical charge transfer channel 321 meanders with threading among photoelectric converters 310 of an associated photoelectric converter column. The vertical charge transfer channel 321 generally extends as one channel in the photoelectric converter column direction $D_V$.

(ii) Each readout gate 330 (readout gate channel region) is adjacent to three edges of the associated photoelectric converter 310 in a plan view.

Excepting the differences (i) and (ii), the solid-state image pickup device 400 is substantially equal in configuration to the solid-state image pickup device 300. Therefore, FIG. 5 shows part of the photoelectric converters 310 and part of the vertical charge transfer elements 320 corresponding thereto, and the other constituent components are not shown. In FIG. 5, same components as those shown in FIG. 4 are assigned with reference numerals obtained by adding 100 to the associated reference numerals used in FIG. 4, and description thereof will be omitted.

When compared with the solid-state image pickup device of the prior art in which a large number of photoelectric converters are arranged in a square matrix pattern, it is possible in the solid-state image pickup device 400 for the reason as for the solid-state image pickup device 100 shown in FIG. 1 that the vertical transfer electrodes (read-cum-transfer electrodes) can be easily formed, and the solid-state image pickup device itself can be easily produced. The integration degree of the photoelectric converters 310 can be easily increased. Sensitivity of the solid-state image pickup device 400 and linearity with respect to above-mentioned F-number of an image pickup optical system can be easily improved. The readout voltage (depletion voltage) of the photoelectric converters 310 can be easily lowered. The capacity per unitary area of the pn junction can be easily increased in the photoelectric converter 310.

As described above, when the solid-state image pickup device is used as an area image sensor in practice, a light shielding layer is arranged to prevent unnecessary photoelectric conversion in areas other than the respective photoelectric converters. When the solid-state image pickup device is used for a single-plate solid-state image pickup device for color image shooting, a color filter is disposed over each photoelectric converter. By disposing a microlens over each photoelectric converter, light utilization efficiency of each photoelectric converter can be increased.

Next, referring to FIG. 6, description will be given of a solid-state image pickup device in the sixth embodiment.

Figure 6:
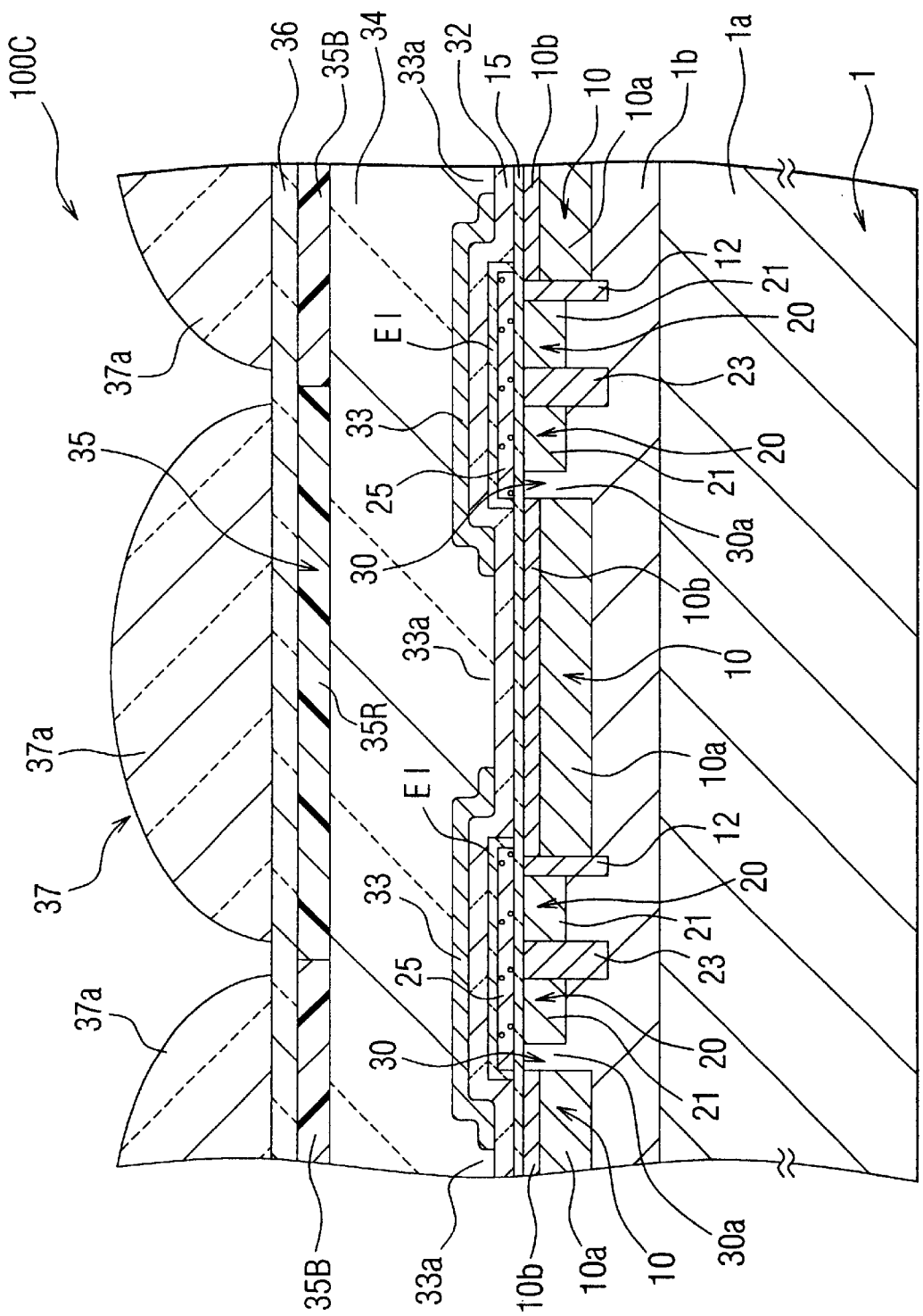
FIG. 6 is a cross-sectional view schematically showing a single-plate solid-state image pickup device for color image shooting in a fifth embodiment of a solid-state image pickup device.
Figure 7:
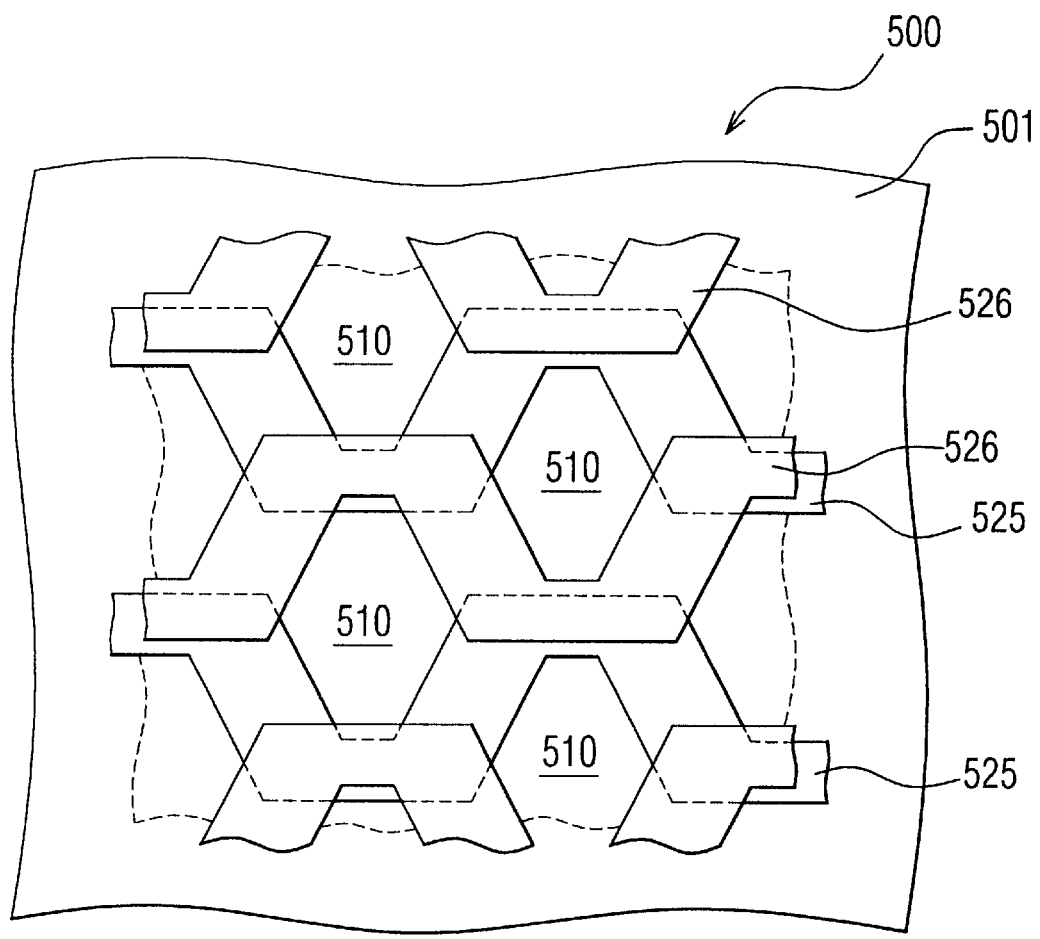
FIG. 7 is a plan view schematically showing layout of photoelectric converters and vertical charge transfer elements in a solid-state image pickup device of the prior art in which a large number of photoelectric converters are arranged in a shifted-pixel layout.

FIG. 6 schematically shows a cross section of a solid-state image pickup device 100C in the fifth embodiment. The solid-state image pickup device 100C is a single-plate solid-state image pickup device for color image shooting produced by adding light shielding layer, color filters, microlenses, and the like to the solid-state image pickup device 100 shown in FIG. 1. Excepting the layout and the contour of each vertical transfer electrode and the contour of each readout gate channel region in a plan view, the solid-state image pickup device 100C is structured in a generally known configuration.

The configuration of a region shown in FIG. 6 ranging from a semiconductor substrate 1 to a vertical charge transfer element 20 corresponds to a cross section along line VI—VI of the solid-state image pickup device 100 shown in FIG. 1. In FIG. 6, same constituent components as those shown in FIG. 1 are assigned with the same reference numerals, and description thereof will be omitted.

In the solid-state image pickup device 100C shown in FIG. 6, the semiconductor substrate 1 includes an n-type semiconductor substrate 1a and a p-type impurity doped region 1b formed in one surface of the n-type semiconductor substrate 1a.

Each photoelectric converter 10 includes an n-type impurity doped region 10a formed in the p-type impurity doped region 1b and a p⁺-type impurity doped region 10b disposed on the n-type impurity doped region 10a. The concentration of the p-type impurity in the p⁺-type impurity doped region 10b is higher than that of the p-type impurity in the p-type impurity doped region 1b.

In a peripheral region of each photoelectric converter 10 in a plan view, a channel stop region 12 is formed excepting a region to form a readout gate channel region 30a. The channel stop region 12 is made of, for example, a p⁺-type impurity doped region.

Each readout gate channel region 30a is arranged along a right edge section of an associated photoelectric converter 10 in FIG. 6. The readout gate channel region 30a is made of, for example, part of the p-type impurity doped region 1b.

A photoelectric converter 10 and an associated vertical charge transfer channel 21 are adjacent to each other via one readout gate channel region 30a. Each vertical charge transfer channel 21 is made of an n-type impurity doped region formed in the p⁺-type doped region 10b.

Another channel stop region 23 is formed in a region in which two vertical charge transfer channels 21 are adjacent to each other and no photoelectric converter 10 intervening therebetween. The channel stop region 23 is made of, for example, a p⁺-type impurity doped region.

On a surface of each impurity doped region, an electrically insulating layer 15 is formed using a silicon oxide or the like. On the electrically insulating layer 15, first read-cum-transfer electrodes 25, second read-cum-transfer electrodes 26, a subordinate transfer electrode 27, and horizontal transfer electrodes are formed.

Readout gate channel regions 30a associated with one photoelectric converter row are covered with a first or second read-cum-transfer electrodes 25 or 26 in plan view. The first and second read-cum-transfer electrode 25 and 26 form readout gates 30 together with the associated readout gate channel regions 30a. FIG. 6 shows only the first read-cum-transfer electrode 25. On a surface of each transfer electrode, an electrically insulating layer EI is formed.

A passivation layer 32 covers each transfer electrodes and exposed surface of electrically insulating layer 15. The passivation layer 32 is formed using, for example, silicon nitride, silicon oxide, phosphosilicate glass (PSG), borophosphosilicate glass (BPSG), or polyimide.

A light shielding layer 33 is formed on the passivation layer 32. The light shielding layer 33 covers each vertical charge transfer element 20 in a plan view and an inner edge section of each photoelectric converter 10 in a plan view.

The light shielding layer 33 includes an opening 33a formed for each photoelectric converter 10. Each opening 33a is disposed over the associated photoelectric converter 10. A region of the photoelectric converter 10 within the opening 33a in a plan view serves as a plane of incidence to receiving light.

The light shielding layer 33 is formed using a metal thin layer of, for example, aluminum, chromium, wolfram, titanium, or molybdenum; a thin layer of an alloy including at least two kinds of the metals above; a multilayer of at least one kind of the metal thin layers or at least one kind of the alloy thin layers; or a multilayer of at least one of the metal thin layers and at least one of the alloy thin layers.

A first planarizing layer 34 covers the light shielding layer 33 and the passivation layer 32 exposed in the openings 33a. The first planarizing layer 34 also serves as a focus adjusting layer for microlenses 37. According to necessity, an inner lens is formed in the first planarizing layer 34 for each photoelectric converter 10.

The first planarizing layer 34 is arranged by forming a coating of a transparent resin, for example, photo resist having desired thickness by, for example, spin coating.

A color filter array 35 is formed on the first planarizing layer 34. The color filter array 35 includes a plurality of kind of color filters in a predetermined pattern to produce a color image. As the color filter arrays for color image shooting, a color filter array of primary color type and a color filter array of complementary color type are known.

In either types of color filter arrays, one color filter (including a colorless filter in the color filter array of complementary color type) is formed for each photoelectric converter 10. Each color filter is disposed over the associated photoelectric converter 10. FIG. 6 shows one red filter 35R and two blue filters 35B.

The color filter array 35 can be disposed, for example, by sequentially forming resin (color resin) layers each of which containing a desired pigment or dye at a predetermined location by, for example, photolithography.

A second planarizing layer 36 is formed on the color filter array 35 to provide a planar area for forming a microlens array 37. The second planarizing layer 36 is formed by coating a transparent resin, for example, photo resist with desired thickness by, for example, spin coating.

The microlens array 37 formed on the second planarizing layer 36 includes a microlens 37a disposed for each photoelectric converter 10. Each microlens 37a is formed over the associated photoelectric converter 10.

The microlenses 37a are fabricated, for example, as follows. A layer of transparent resin (including photo resist) having a refractive index from about 1.3 to about 2.0 is disposed on the second planarizing layer 36 and subdivided into partitions of a predetermined contour by photolithography or the like, each partition of the transparent resin is molten by heat treatment. Edges of each partition are rounded by surface tension and then the partition is cooled down. One microlens 37a is produced using one partition of the transparent resin.

The solid-state image pickup device 100C shown in FIG. 6 is a single-plate solid-state image pickup device for color image shooting, which can be produced using the solid-state image pickup device 100 of the first embodiment. Therefore, the solid-state image pickup device 100C also leads to advantages similar to those of the solid-state image pickup device 100.

By disposing a light shielding layer, a color filter array, and a microlens array on the solid-state image pickup device 200, 300, or 400 shown in FIGS. 3, 4, or 5 as described above, a single-plate solid-state image pickup device for color image shooting can be produced.

In imaging apparatuses such as an electronic still camera and a digital camera using a solid-state image pickup device, an imaging optical system is arranged in the front of the solid-state image pickup device (in an entrance optics). The imaging optical system includes, for example, optical lenses, an iris, and an optical low-pass filter and produces an optical image focused on the solid-state image pickup device. The solid-state image pickup device then converts the optical image into electric signals (image signals) and outputs the signals to a video signal proceeding circuit. According to the image signals, the circuit generates a large number of pixel signals to reproduce an image. The pixel signals are outputted to, for example, a display or a storage device.

Description has been given of the embodiments of the solid-state image pickup device. However, the present invention is not limited by the embodiments.

Particularly, excepting the configuration in which only one read-cum-transfer electrode, which surrounds each associated photoelectric converter in a plan view, is disposed for each photoelectric converter row, the configuration of the solid-state image pickup device can be changed in various ways. The changeable configuration includes the contour of each read-cum-transfer electrode and the contour of each opening of the read-cum-transfer electrode in a plan view.

For example, by adding one or two vertical transfer electrodes exclusively to charge transfer for each photoelectric converter row such that each vertical charge transfer element has three or four vertical transfer electrodes for each photoelectric converter, a solid-state image pickup device of progressive scan type can be produced. Each of the vertical transfer electrodes exclusively to charge transfer is disposed, for example, downstream or upstream of an associated photoelectric converter row, the vertical transfer electrode being adjacent or adjoin to a read-cum-transfer electrode associated with the photoelectric converter row.

It is to be appreciated that those skilled in the art can conduct various changes, modifications, and combinations for the embodiments.

According to the present invention as described above, there is provided a solid-state image pickup device having a configuration in which performance of the device can be easily improved and the production cost thereof can be easily lowered.

What we claim are:

1. A solid-state image pickup device, comprising:
   a semiconductor substrate having one surface;
   a large number of photoelectric converters formed in the one surface of said semiconductor substrate in a matrix pattern including a plurality of rows and a plurality of columns;

a vertical charge transfer channel formed in the one surface of said semiconductor substrate adjacent to each column of said photoelectric converters;

an electrically insulating layer disposed on the one surface of said semiconductor substrate; and a read-cum-transfer electrode formed on said electrically insulating layer, crossing said vertical charge transfer channels and surrounding photoelectric converters of each of said rows of the photoelectric converters in a plan view.

2. A solid-state image pickup device according to claim 1, wherein:

said large number of photoelectric converters are arranged in a shifted-pixel layout; and each said vertical charge transfer channel meanders along an associated column of said photoelectric converters.

3. A solid-state image pickup device according to claim 1, wherein said large number of photoelectric converters are arranged in a square matrix pattern.

4. A solid-state image pickup device according to claim 3, wherein each said vertical charge transfer channel meanders with threading among said photoelectric converters of an associated column of said photoelectric converters.

5. A solid-state image pickup device according to claim 1, wherein an edge section in line width direction of every second said read-cum-transfer electrode overlaps with another every second said read-cum-transfer electrode.

6. A solid-state image pickup device according to claim 2, wherein an edge section in line width direction of every second said read-cum-transfer electrode overlaps with another every second said read-cum-transfer electrode.

7. A solid-state image pickup device according to claim 1, wherein said read-cum-transfer electrodes are arranged with being apart from each other.

8. A solid-state image pickup device according to claim 2, wherein said read-cum-transfer electrodes are arranged with being apart from each other.

9. A solid-state image pickup device according to claim 1, wherein upper surfaces respectively of said read-cum-transfer electrodes are at substantially an identical level.

10. A solid-state image pickup device according to claim 2, wherein upper surfaces respectively of said read-cum-transfer electrodes are at substantially an identical level.

11. A solid-state image pickup device according to claim 1, wherein each of said read-cum-transfer electrodes includes side surfaces obliquely crossing, in a plan view, said vertical charge transfer channels.

12. A solid-state image pickup device according to claim 2, wherein each of said read-cum-transfer electrodes includes side surfaces obliquely crossing, in a plan view, said vertical charge transfer channels.

13. A solid-state image pickup device according to claim 1, further comprising a readout gate channel region disposed for each photoelectric converter, each said readout gate channel region being formed in the surface of said semiconductor substrate with standing between an associated photoelectric converter and an vertical charge transfer channel associated with the photoelectric converter, each said readout gate channel region adjoining to said associated photoelectric converter in at least about one quarter of a circumferential region of said associated photoelectric converter.

14. A solid-state image pickup device according to claim 2, further comprising a readout gate channel region disposed for each photoelectric converter, each said readout gate channel region being formed in the surface of said semiconductor substrate with standing between an associated photoelectric converter and an vertical charge transfer channel associated with the photoelectric converter, each said readout gate channel region adjoining to said associated photoelectric converter in at least about one quarter of a circumferential region of said associated photoelectric converter.

15. A solid-state image pickup device according to claim 1, further comprising a readout gate channel region disposed for each photoelectric converter, each said readout gate channel region being formed in the surface of said semiconductor substrate with standing between an associated photoelectric converter and an vertical charge transfer channel associated with the photoelectric converter, each said photoelectric converter including at least four edges, each said readout gate channel region adjoining to an associated photoelectric converter element in at least two edges of said associated photoelectric converter element, as viewed in plan.

16. A solid-state image pickup device according to claim 2, further comprising a readout gate channel region disposed for each photoelectric converter, each said readout gate channel region being formed in the surface of said semiconductor substrate with standing between an associated photoelectric converter and an vertical charge transfer channel associated with the photoelectric converter, each said photoelectric converter including at least four edges, each said readout gate channel region adjoining to an associated photoelectric converter element in at least two edges of said associated photoelectric converter element in a plan view.

* * * * *